TUNABLE PHASE SHIFT OSCILLATOR WITH VARIABLE RC FILTER

Filed June 7, 1961 3 Sheets-Sheet 1

WITNESSES
Leon J. Taza
James F. Young

INVENTOR
Philipp R. Amlinger
BY R. J. Brodahl
ATTORNEY

United States Patent Office 3,183,453
Patented May 11, 1965

3,183,453

TUNABLE PHASE SHIFT OSCILLATOR WITH VARIABLE RC FILTER

Philipp R. Amlinger, Latrobe, Pa., assignor to Westinghouse Electric Corporation, East Pittsburgh, Pa., a corporation of Pennsylvania Filed June 7, 1961, Ser. No. 115,544
3 Claims. (Cl. 331—108)

The present invention relates to tunable oscillator cricuits, and more particularly to tunable oscillator circuits suitable for construction in a monolithic form.

To provide an oscillator, an amplifier with a suitable feedback characteristic may be used by adjusting the gain of the amplifier and the feedback chaarcteristic to establish the oscillatory criterion. The necessary phase shift in the feedback loop may be provided by a filter network. Amplifiers in monolithic form are well known in the art. If a filter in monolithic form having the desired feedback characteristic were combined in a monolith with a molecular amplifier, an oscillataor in molecular block form could be provided. Suitable phase shift filters in monolithic form having narrow band rejection characteristics, commonly called "notch" filters, have been developed, e.g. see copending applications Serial Nos. 5,045, filed January 27, 1960, 64,854, filed October 25, 1960 and 88,436, filed February 9, 1961 and assigned to the assignee of the present invention. These filter devices equivalently provide a distributed resistive-capacitive network which in co-operation with a lumped resistor give the desired phase shift characteristics. The characteristics of the filter device may be controlled by adjusting the bias voltage applied to the semiconductive structure, as the resistive-capacitive network is created by a reverse biased p-n junction. In order to tune the oscillator utilizing the filter device in monolithic form by changing its feedback characteristics, the filter device must be biased so as to give the necessary phase shift and also the ratio of the distributed resistance to the lumped resistance must be so chosen as to enable sustained oscillations. The problems arise of biasing the filter device so that the D.C. operating levels of the oscillator are not affected by changes in the bias voltage, and also of not changing the ratio of distributed to lumped resistances through interaction with the biasing means itself.

It is therefore an object of the present invention to provide a new and improved oscillator using a phase shift filter device in monolithic form in the feedback loop.

It is a further object of the present invention to provide a new and improved oscillator in which a phase shift filter device in monolithic form is used in the feedback loop and is so biased as not to affect the operating conditions of the oscillator itself.

The present invention broadly provides an oscillator wherein: a transistor amplifier, which may have a plurality of stages, utilizes a phase shift "notch" filter device in monolithic form in the feedback loop; with the filter device having a distributed resistive-capacitive characteristic and a lumped resistor operatively connector therewith; the filter device being biased through the lumped resistance so as not to affect D.C. operating level of the oscillator and with the value of the lumped resistor remaining essentially constant when the bias voltage is changed.

These and other objects will become more apparent considered in the light of the following specification and drawings, in which.

Figure 1:
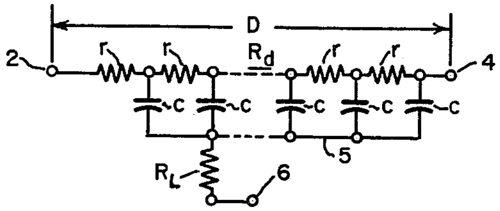
FIGURE 1 is an equivalent circuit phase shift notch filter as used in the present invention.

Referring to FIG. 1, the equivalent circuit for a notch filter is shown having the incremental resistors $r$ forming the distributed resistance between terminals 2 and 4. The total distributed resistances $R_d$ is then $r$ times the distance D. The distributed incremental capacitors $c$ are connected between the incremental resistors $r$ and the common line 5. The lumped resistor $R_L$ is connected between the common line 5 and the terminal 6.

Figure 3:
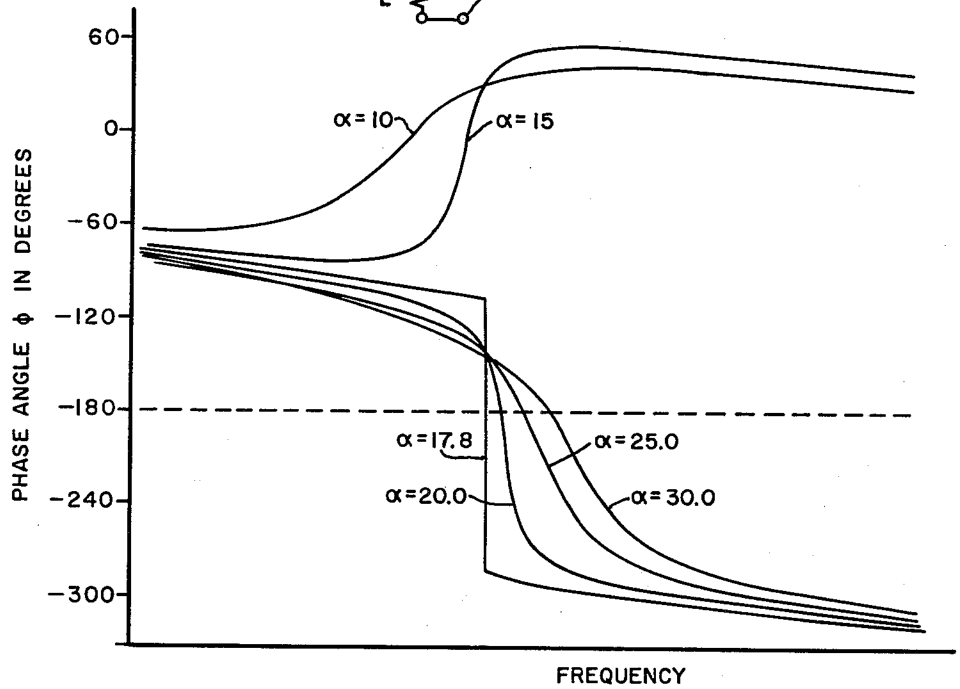
FIG. 3 is a plot of the phase angle of a notch filter device as a function of frequency.
Figure 2:
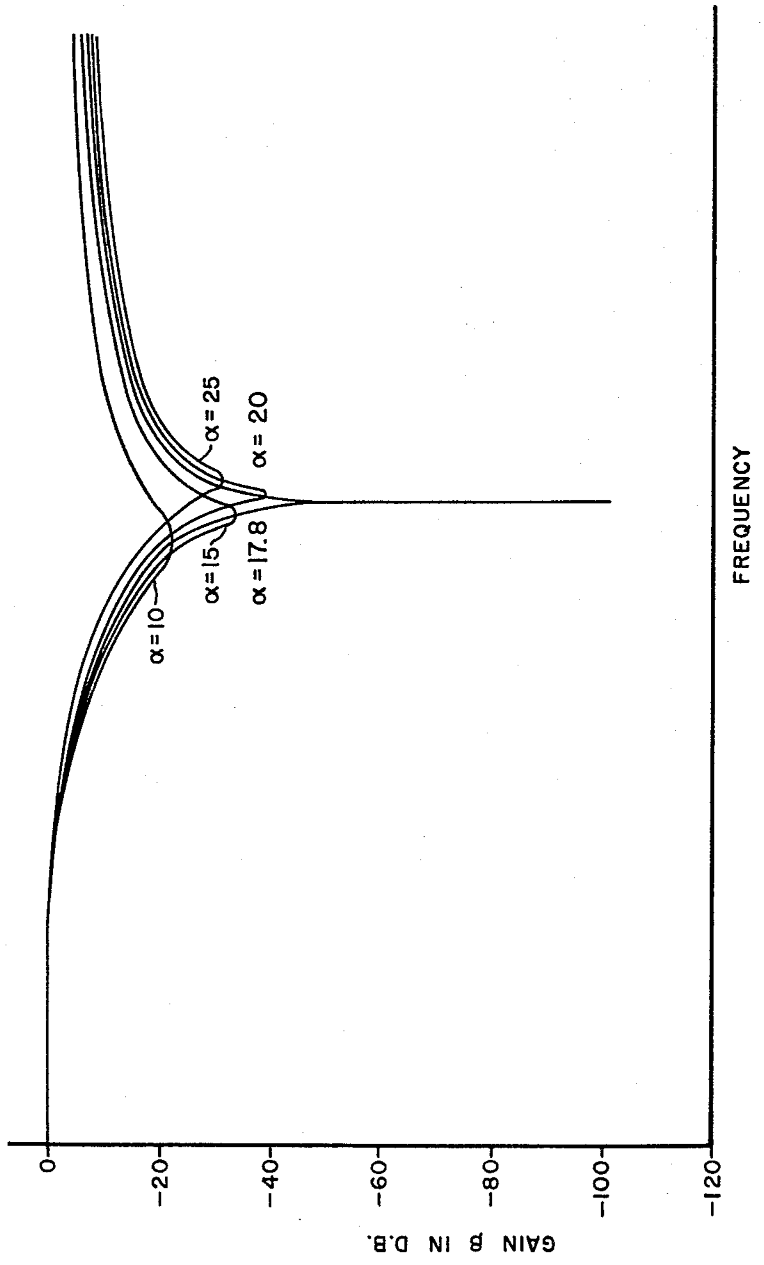
FIG. 2 is a plot of the feedback gain of a notch filter device as a function of frequency.

In FIGS. 2 and 3 the characteristics of a phase shift "notch" filter device are shown. FIG. 2 shows the notch characteristic for various values of the ratio of the distributed resistance $R_d$ to the lumped resistance $R_l$, where $\alpha$ is defined as this ratio. FIG. 3 shows the phase shift as a function of frequency for various values of $\alpha$. By varying the reverse bias voltage across the "notch" filter, the device may be tuned to give the desired phase shift characteristics.

Figure 4:
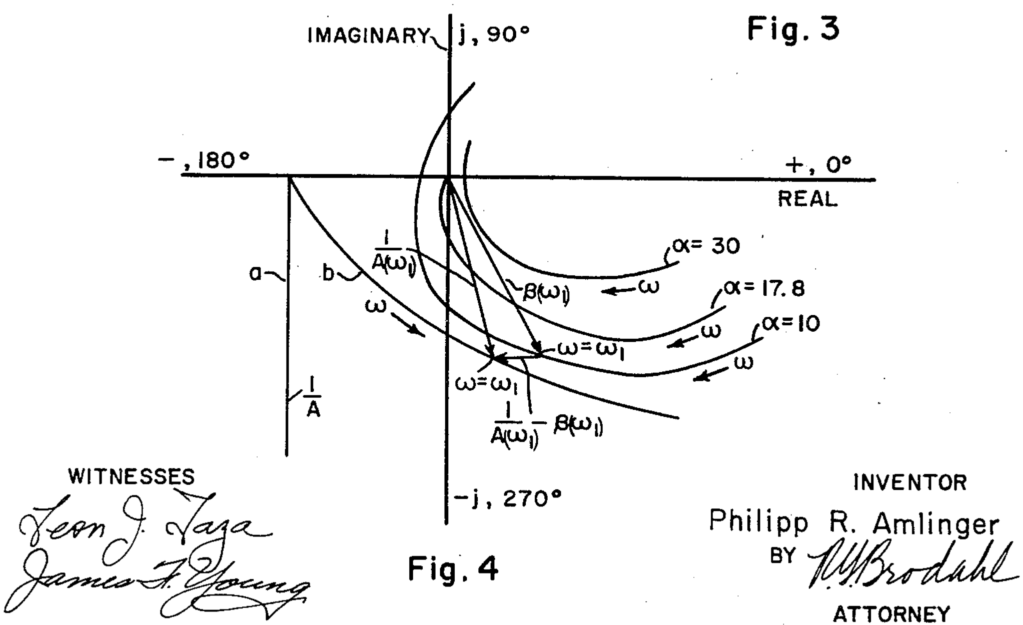
FIG. 4 is a polar plot of characteristics of an oscillator in the complex plane.

A polar plot in the complex plane is shown in FIG. 4 for a typical single and two-stage transistor amplifier. The equation for the gain of an amplifier with feedback is given by:

$$g=\frac{A}{1-A\beta}$$

or $$g=\frac{1}{\frac{1}{A}-\beta}$$

where A is the gain without feedback, and $\beta$ is the transfer function of the feedback network. The oscillatory condition being when:

$$\left|\frac{1}{A}\right|\leq|\beta|$$

at a particular frequency. The plot of the inverse gain $$\frac{1}{A}$$

is shown as curve $a$, for a single stage amplifier, and as curve $b$ for a two-stage amplifier. The $\beta$ plots are shown for various values of $\alpha$, for a phase shift filter device. It should be noted that the relative magnitude of $\beta$ decreases with increasing $\alpha$. The closest condition for oscillation is shown at the angular frequency $\omega_1$, for the two-stage case with $\alpha=10$. At this frequency $\omega_1$ the vector addition of the inverse gain function vector $$\frac{1}{A(\omega_1)}$$

and the transfer function vector $\beta(\omega_1)$ have a minimum difference vector $$\frac{1}{A(\omega_1)}-\beta(\omega_1)$$

If the inverse gain and feedback curves should overlap at a given frequency the amplifier will sustain oscillations, satisfying the condition that $$|\beta|\geq\left|\frac{1}{A}\right|$$

Figure 5:
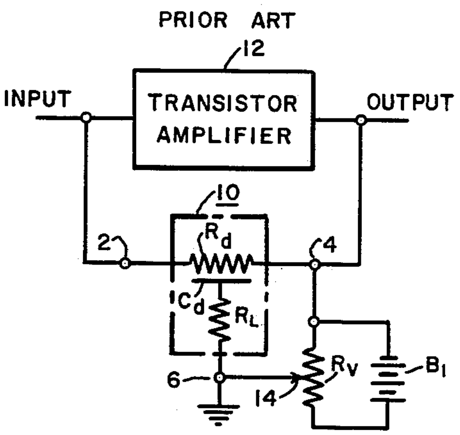
FIG. 5 is a schematic-block diagram of an oscillator using prior art biasing techniques.

FIG. 5 shows the prior art method of biasing the "notch" filter enclosed in the dotted block 10. The filter 10 is connected in the feedback path of the transistor amplifier 12. The block 10 is the schematic representation for the equivalent circuit of the filter device as shown in FIG. 1. The reverse bias which is applied to the filter device 10 is provided between terminal 4 and terminal 6, which is grounded, by the voltage divider $R_V$ which has the battery $B_1$ connected thereacross. In order to tune the oscillator shown in FIG. 5, the voltage tap 14 on the voltage divider $R_V$ is adjusted to give the desired feedback characteristics for oscillations to be sustained at a desired frequency. By having the bias applied between the terminals 4 and 6, the bias voltage is directly in the feedback path, and upon changing the setting of the voltage tap 14 for tuning purposes, the D.C. operating level of the oscillator can be altered to affect the stability of oscillations.

Figure 6:
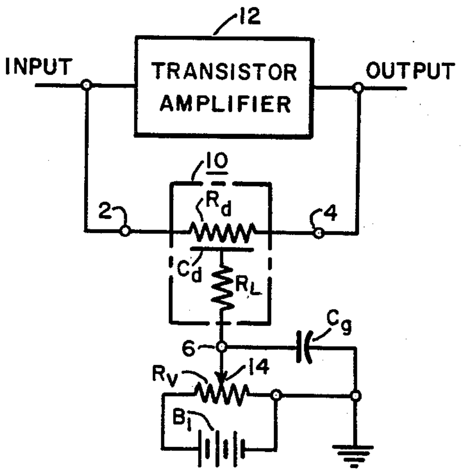
FIG. 6 is a schematic-block diagram of an oscillator embodying biasing techniques of the present invention.

The biasing means as proposed in the present invention are shown in the oscillator circuit of FIG. 6. The bias potential is applied to the terminal 6 through the voltage divider $R_V$ from the center tap 14 with the negative terminal of the battery $B_1$ being grounded. Capacitor $C_g$ is connected between the terminal 6 and ground, thus effectively keeping the terminal 6 at ground potential for alternating current at the oscillatory frequencies. Without the capacitor $C_g$, part of the resistance of the voltage divider $R_V$ between the tap 14 and ground would effectively be in the circuit of the lumped resistance $R_1$, thus increasing the lumped resistance of the "notch" filter 10. As the voltage divider resistance $R_V$ must necessarily be of a relatively high value so as not to be an excessive drain on the battery $B_1$, the addition of part of this resistance $R_V$ to the lumped resistance $R_1$ would adversely affect the feedback characteristics of the filter 10. If the lumped resistance of the notch filter were greatly increased, the ratio of the distributed to lump resistance $\alpha$ will be greatly decreased. From FIGS. 2 and 3 it can be readily seen that for effective utilization of the "notch" characteristic and phase shift characteristics of the filter that $\alpha$ should be kept within the range of 10 to 25. Therefore, by the connection of capacitor $C_g$ from terminal 6 to ground, the value of the lumped resistor $R_L$ is clamped to a critical predetermined value in relation to the distributed resistance $R_d$ of the notch filter 10.

Figure 7:
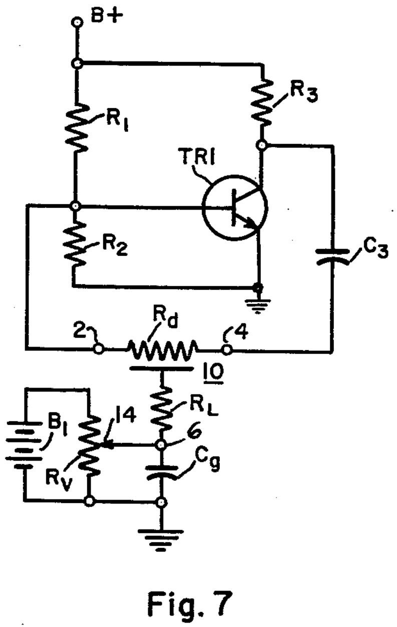
FIG. 7 is a schematic diagram of a single stage transistor oscillator embodying the principles of the present invention; and, FIG. 8 is a schematic diagram of a two-stage transistor oscillator embodying the principles of the present invention.

FIG. 7 shows an oscillator circuit including the biasing means of FIG. 6 in which a single amplifying stage is utilized. The transistor TR1 is connected through the coupling capacitor C3 to the distributed resistance of the "notch" filter 10 at the terminal 4. Terminal 2 of the "notch" filter is then returned to the base of the transistor TR1. From B+, the resistors R1 and R3 are connected to the base and collector of the transistor TR1, respectively, and the resistor R2 is connected between the base and the emitter of the transistor TR1 with the circuit including the transistor TR1 operating as a common emitter amplifier. The reverse bias on the "notch" filter 10 is adjusted through the tap 14 to tune the oscillator to a desired frequency of oscillation. So with the gain of the transistor TR1 adjusted to a predetermined value and the bias adjusted through the tap 14 on the voltage divider $R_V$, the oscillator circuit is tuned without adversely affecting the D.C. operating point of the oscillator circuit. Also, as the lumped resistor $R_L$ of the phase shift filter 10 is clamped to ground for A.C. through the capacitor $C_g$, the feedback characteristics of the filter 10 are not affected by changes of the reverse bias, when the setting of the tap 14 is varied.

Figure 8:
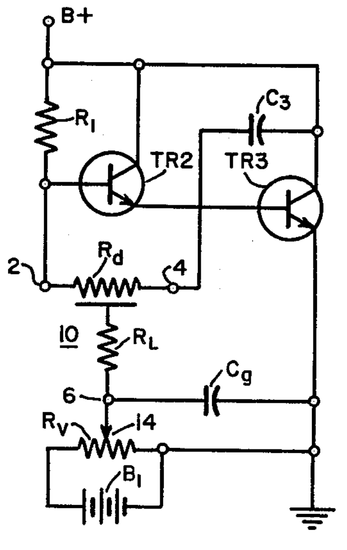

FIG. 8 shows a two-stage transistor amplifier being used in conjunction with the phase shift "notch" filter feedback circuit to provide an oscillator. The emitter of the transistor TR2 is connected to the base of the transistor TR3 whose output through its collector is applied through the coupling capacitor C3 to terminal 4 of the phase shifter filter 10. Terminal 2 of the notch filter 10 is connected to the base of transistor TR2. The emitter of the output transistor TR3 is connected to ground. The operation of the single stage and the two-stage circuits are substantially similar except the two-stage transistor has a greater phase shift range over which oscillations may be sustained by adjustments of the bias on the "notch" filter 10.

The advantages thus obtained by using the biasing arrangement as shown in FIGS. 6, 7 and 8, are that the D.C. operating levels of the transistor circuitry are not affected by adjusting the bias on the "notch" filter 10 for tuning purposes; and also the value of the lumped resistor $R_L$ of the notch filter is not affected by these adjustments, since the value is maintained substantially constant at the oscillatory frequency by the capacitor $C_g$ connected to ground.

Although the present invention has been described in a certain degree of particularity, it should be understood that the present disclosure has been made only by way of example and that numerous changes in the details of the circuitry and the combination and arrangement of elements may be resorted to without departing from the scope and spirit of the present invention.

I claim as my invention:

1. A tunable oscillator including: transistor amplifying means having input and output terminals; a phase shift filter device in a monolithic structure having a distributed resistance connected between said input and output terminals, a distributed capacitance operative with said distributed resistance to form a resistive-capacitive network, and a lumped resistor operatively connected to said distributed capacitance, with the feedback characteristics of said phase shift device being dependent on the bias voltage applied thereto; capacitor means connected between said lumped resistance and ground and means connected in parallel with said capacitor means for applying a variable D.C. bias voltage between said lumped resistance and ground, whereby a reverse D.C. bias may be applied to change the tuning of the oscillator while the value of the lumped resistance to A.C. ground and the feedback characteristics remain substantially unchanged.

2. A tunable oscillator including: transistor amplifying means having input and output terminals; a phase shift filter device in a monolithic structure having a distributed resistance connected between said input and output terminals, a distributed capacitance operatively connected with said distributed resistanice to form a resistive-capacitive network, and a lumped resistance, with the feedback characteristics of said phase shift device being dependent on the bias voltage applied thereto; a unidirectional voltage source; a voltage divider connected across said source and having an adjustable voltage tap thereon, with the resistance of said voltage divider being substantially higher than said lumped resistance, said lumped resistance being connected between said distributed capacitance and said voltage tap to provide bias voltage to said filter device in proportion to the setting of said voltage tap; and a capacitor connected between said voltage tap and ground.

3. A tunable oscillator including: transistor amplifying means having input and output terminals and including a plurality of stages; a phase shift filter device having a desired phase shift characteristic in a monolithic structure and including a distributed resistance connected between said input and output terminals, a distributed capacitance operative with said distributed resistance to form a resistive-capacitive network, and a lumped resistor, with the feedback characteristics of said filter device being dependent on the bias voltage applied thereto; voltage divider means having an adjustable voltage tap thereon to tune said filter device, with the resistance of said voltage divider being substantially higher than said lumped resistance, said lumped resistor being connected between said distributed capacitance and said voltage tap to provide bias voltage to said filter device in proportion to the setting of said voltage tap; and a capacitor connected between said voltage tap and ground.

References Cited by the Examiner

UNITED STATES PATENTS

| | | | |
|---|---|---|---|
| 2,791,693 | 5/57 | Moore | 331—109 |
| 2,816,228 | 12/57 | Johnson | 331—135 |

ROY LAKE, *Primary Examiner.*

JOHN KOMINSKI, *Examiner.*